(12) United States Patent
Wang et al.

(10) Patent No.: US 11,437,284 B2
(45) Date of Patent: Sep. 6, 2022

(54) CONTACT OVER ACTIVE GATE STRUCTURE

(71) Applicant: Applied Materials, Inc., Santa Clara, CA (US)

(72) Inventors: Wenhui Wang, San Jose, CA (US); Huixiong Dai, San Jose, CA (US); Christopher S. Ngai, Burlingame, CA (US)

(73) Assignee: Applied Materials, Inc., Santa Clara, CA (US)

( * ) Notice: Subject to any disclaimer, the term of this patent is extended or adjusted under 35 U.S.C. 154(b) by 62 days.

(21) Appl. No.: 16/550,784

(22) Filed: Aug. 26, 2019

(65) Prior Publication Data
US 2020/0075422 A1 Mar. 5, 2020

Related U.S. Application Data

(60) Provisional application No. 62/725,366, filed on Aug. 31, 2018.

(51) Int. Cl.
| | | |
|---|---|---|
| *H01L 29/40* | (2006.01) | |
| *H01L 21/311* | (2006.01) | |
| *H01L 21/8234* | (2006.01) | |
| *H01L 29/78* | (2006.01) | |
| *H01L 29/66* | (2006.01) | |

(52) U.S. Cl.
CPC ......... *H01L 21/823475* (2013.01); *H01L 21/31144* (2013.01); *H01L 29/401* (2013.01); *H01L 29/66477* (2013.01); *H01L 29/78* (2013.01)

(58) Field of Classification Search
CPC ....... H01L 21/76897; H01L 21/76877–76883; H01L 29/66515; H01L 29/66537–6656
See application file for complete search history.

(56) References Cited

U.S. PATENT DOCUMENTS

| | | | |
|---|---|---|---|
| 9,041,217 B1 | 5/2015 | Bristol et al. | |
| 9,530,733 B2 | 12/2016 | Bristol et al. | |
| 9,564,363 B1 * | 2/2017 | Wang | H01L 21/76895 |
| 10,236,364 B1 * | 3/2019 | Cheng | H01L 21/76816 |
| 10,243,053 B1 * | 3/2019 | Xie | H01L 21/28123 |

(Continued)

FOREIGN PATENT DOCUMENTS

| | | |
|---|---|---|
| WO | 2016209205 A1 | 12/2016 |
| WO | 2016209296 A1 | 12/2016 |

OTHER PUBLICATIONS

Auth, C., et al., "A 10nm High Performance and Low-Power CMOS Technology Featuring 3rd Generation FinFET Transistors, Self-Aligned Quad Patterning, Contact over Active Gate and Cobalt Local Interconnects", IEDM (2017), pp. IEDM17-673 thru IEDM17-676.

(Continued)

*Primary Examiner* — Allen L Parker
*Assistant Examiner* — Gustavo G Ramallo
(74) *Attorney, Agent, or Firm* — Servilla Whitney LLC

(57) ABSTRACT

Methods of forming and processing semiconductor devices which utilize a three-color hardmask process are described. Certain embodiments relate to the formation of self-aligned contacts for metal gate applications. More particularly, certain embodiments relate to the formation of self-aligned gate contacts through the selective deposition of a fill material.

17 Claims, 5 Drawing Sheets

(56) References Cited

U.S. PATENT DOCUMENTS

| | | | |
|---|---|---|---|
| 10,943,990 B2* | 3/2021 | Greene | H01L 21/76897 |
| 11,164,782 B2* | 11/2021 | Xie | H01L 27/1104 |
| 11,205,590 B2* | 12/2021 | Fan | H01L 23/53266 |
| 2012/0032275 A1* | 2/2012 | Haran | H01L 29/7843 |
| | | | 257/E21.409 |
| 2014/0077305 A1* | 3/2014 | Pethe | H01L 21/76807 |
| | | | 257/368 |
| 2017/0263551 A1 | 9/2017 | Bristol et al. | |
| 2017/0278752 A1 | 9/2017 | Ryckaert et al. | |
| 2017/0330761 A1 | 11/2017 | Chawla et al. | |
| 2017/0330794 A1 | 11/2017 | Hourani et al. | |
| 2018/0138176 A1* | 5/2018 | Shen | H01L 21/76831 |
| 2018/0166274 A1* | 6/2018 | Lin | H01L 21/02244 |

OTHER PUBLICATIONS

Clark, R., et al., "Perspective: New process technologies required for future devices and scaling", APL Materials 6, 058203 (2018), 12 pages.

* cited by examiner

CONTACT OVER ACTIVE GATE STRUCTURE

CROSS-REFERENCE TO RELATED APPLICATIONS

This application claims priority to U.S. Provisional Application No. 62/725,366, filed Aug. 31, 2018, the entire disclosure of which is hereby incorporated by reference herein.

TECHNICAL FIELD

Embodiments of the present invention pertain to the field of electronic device manufacturing and methods for device patterning. In particular, embodiments pertain to the use of selective deposition in contact over active gate applications.

BACKGROUND

Reducing the size of integrated circuits (ICs) results in improved performance, increased capacity, and/or reduced cost. Each size reduction requires more sophisticated techniques to form the ICs. Shrinking transistor size, for example, allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of ICs, multi-gate transistors have become more prevalent as device dimensions continue to scale down. Scaling multi-gate transistors has not been without consequence, however. As the dimensions of these fundamental building blocks of microelectronic circuitry are reduced, and as the number of building blocks fabricated in a given region increases, the constraints on the lithographic processes used to pattern these building blocks becomes overwhelming.

Photolithography is commonly used to pattern ICs on a substrate. An exemplary feature of an IC is a line of a material which may be a metal, semiconductor, or insulator. Due to factors such as optics and light or radiation wavelength, however, photolithography techniques are restricted by a minimum pitch, below which a particular photolithographic technique may not reliably form features. Thus, the minimum pitch of a photolithographic technique can limit feature size reduction of ICs.

Processes such as self-aligned double patterning (SADP), self-aligned quadruple patterning (SAQP), and litho-etch-litho-etch (LELE) may be used for extending the capabilities of photolithographic techniques beyond the minimum pitch capabilities of existing lithographic equipment. Following the SADP, SAQP, or LELE process, multi-cut or block masks are placed over the lines and spaces generated by SADP, SAQP, or LELE processes to perform device patterning. As the feature size decreases, pitch and linewidth also decrease. Therefore the precision of mask edge placement control must be higher. Equipment capable of meeting such tight geometric requirements are extremely expensive, and additionally, such tight geometric requirements also contribute to low production yields.

Therefore, there is a need for improved methods for device patterning to reduce defects from pattern misalignment and increase production yields.

SUMMARY

One or more embodiments of the disclosure are directed to methods of forming a contact. In one embodiment, a method of forming a contact comprises forming at least one gate stack over an active region on a substrate. The at least one gate stack has a first side and a second side and comprises a gate and a gate cap comprising a first material. The substrate has a spacer material adjacent the first side and the second side of the at least one gate stack, a source material with a source cap comprising a second material on an opposite side of the spacer material adjacent the first side of the at least one gate stack, and a drain material with a drain cap comprising the second material on an opposite side of the spacer material adjacent the second side of the at least one gate stack. An interlayer dielectric (ILD) comprising the second material is formed on the gate cap, spacer material, source cap, and drain cap. A first mask layer is formed on the interlayer dielectric (ILD). The interlayer dielectric (ILD) and the first mask layer have at least one opening exposing one or more of a surface of the gate cap, a surface of the spacer material, a surface of the source material, or a surface of the drain material. The gate cap is removed to expose a surface of the gate. A gate contact is formed on one of the surface of the gate, the surface of the source material, or the surface of the drain material. A source/drain contact is formed on one or more of the surface of the gate material, the surface of the drain material, the surface of the spacer material, or the surface of the gate cap.

In one embodiment, a method of forming a contact comprises forming at least one gate stack over an active region on a substrate, the at least one gate stack having a first side and a second side and comprising a gate and a gate cap comprising a first material, the substrate having a spacer material adjacent the first side and the second side of the at least one gate stack, a source material with a source cap comprising a second material on an opposite side of the spacer material adjacent the first side of the at least one gate stack, a drain material with a drain cap comprising the second material on an opposite side of the spacer material adjacent the second side of the at least one gate stack. An interlayer dielectric (ILD) comprising the second material is formed on the gate cap, spacer material, source cap, and drain cap. A first mask layer is formed on the interlayer dielectric (ILD), the interlayer dielectric (ILD) and the first mask layer have at least one opening. One of the source cap or the drain cap is selectively etched through the at least one opening to expose a surface of the gate cap and a surface of the spacer material, and to expose one of a surface of the source material or a surface of the drain material. A fill material is selectively deposited on one of the exposed surface of the source material or the exposed surface of the drain material. The gate cap is removed to expose a surface of the gate. A gate contact is formed on the surface of the gate.

One or more embodiments of the present disclosure are directed to an electronic device. In one embodiment, an electronic device comprises a substrate having an active region with at least one gate stack formed thereon, the at least one gate stack having a first side and a second side and comprising a gate and a gate cap comprising a first material. A spacer material is on the substrate adjacent the first side and second side of the at least one gate stack. A source material with a source cap comprising a second material, the source material and source cap are adjacent one of the first side or second side of the at least one gate stack opposite the spacer material. A drain material with a drain cap comprising the second material, the drain material and the drain cap are adjacent the other of the first side or the second side of the at least one gate stack opposite the spacer material. A fill material is on the drain material or on the source material, the fill material having a top surface substantially coplanar with one or more of a top surface of the spacer material, a top surface of the drain cap, or a top surface of the source cap. An interlayer dielectric (ILD) is on one or more of the spacer material, the gate cap, the drain cap, or the source cap. Optionally, a first mask layer is on the interlayer dielectric (ILD).

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1A:
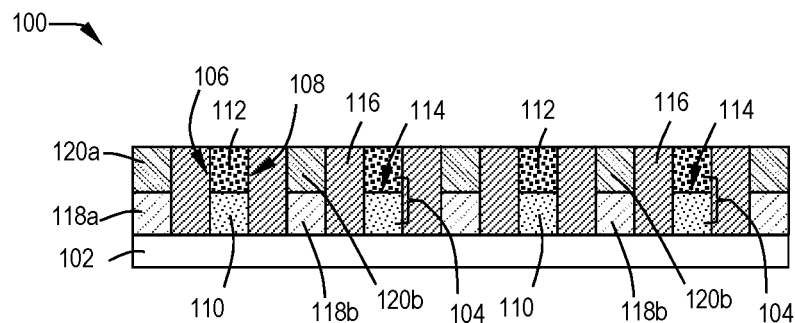
FIG. 1A illustrates a cross-sectional view of a contact over active gate structure according to one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

As used in this specification and the appended claims, the term "linewidth" refers to the width of the line of a material which may be a metal, semiconductor, or insulator, and the term "spacing" refers to the distance between adjacent lines. As used in this specification and the appended claims, the term "pitch" is defined as the distance between a same point on two adjacent lines. The pitch is equal to the sum of the linewidth and the spacing.

One or more embodiments of the present disclosure are directed to semiconductor structures or devices having one or more gate contact structures (e.g. gate contact vias) disposed over active portions of gate electrodes of the semiconductor structures or devices.

Transistors are circuit components or elements that are often formed on semiconductor devices. Many transistors may be formed on a semiconductor device in addition to capacitors, inductors, resistors, diodes, conductive lines, or other elements, depending upon the circuit design. The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals.

Generally, a transistor includes a gate stack formed between source and drain regions. The source and drain regions may include a doped region of a substrate and may exhibit a doping profile suitable for a particular application. The gate stack is positioned over the channel region and may include a gate dielectric interposed between a gate electrode and the channel region in the substrate.

As used herein, the term "field effect transistor" or "FET" refers to a transistor that uses an electric field to control the electrical behavior of the device. Field effect transistors generally display very high input impedance at low temperatures. The conductivity between the drain and source terminals is controlled by an electric field in the device, which is generated by a voltage difference between the body and the gate of the device.

As used in this specification and the appended claims, the term COAG "contact over active gate" or "COAG" refers to a process feature whereby the gate contact is stacked on top of the gate where there is an active region underneath, thereby improving transistor density. COAG is a feature that provides an additional 10% area scaling.

A COAG semiconductor structure or device includes a diffusion or active region disposed in a substrate, and within an isolation region. One or more gate lines (also known as polylines) are disposed over the diffusion or active region as well as over a portion of the isolation region. Source or drain contacts are disposed over source and drain regions of the semiconductor device. Source or drain contact vias provide contact to source or drain contacts. A separate gate contact, and overlying gate contact via, provides contact to a gate line.

Typically, in the fabrication of COAG structures, at least a four-color hardmask scheme is necessary, creating challenges for integration, material, and etching. As used herein, the term "four-color" refers to four different materials which are selectively etchable relative to each other. The more colors required, the more complex/difficult integration becomes.

Some embodiments of the disclosure advantageously provide methods to enable self-aligned contact over active gate (COAG) using a three-color processing scheme. The three-color processing scheme of one or more embodiments advantageously minimizes usage of selective-deposition materials, leading to minimal impact on performance and minimal flow change compared to a process that uses a four color COAG. In some embodiments, no source/drain cap hardmask is need, resulting in fewer process steps.

The embodiments of the disclosure are described by way of the Figures, which illustrate processes for forming contacts in accordance with one or more embodiments of the disclosure as exemplary process flows using a three-color (ABC) etch process. The term "three-color" refers to three different materials which are selectively etchable relative to each other. In other words, one material will be etched, while the other two materials will not be etched. The processes shown are merely illustrative possible uses for the disclosed processes, and the skilled artisan will recognize that the disclosed processes are not limited to the illustrated applications.

As used herein, the term "active region" refers to a region which comprises active areas that play an active role in the functioning of a semiconductor device. For example, in a semiconductor substrate having formed thereon a field effect transistor (FET), an active region typically refers to a substrate area having formed thereon various sub-features of the field effect transistor, including, e.g., a source, a drain, and a channel connecting the source and the drain. A gate stack is located over the active region and typically covers a portion thereof. The gate stack may, for example, cover at least a portion of the channel in a field effect transistor. A gate dielectric is typically located between a gate electrode and the active region and prevents a direct electrical contact there-between. A spacer material is typically an electrically insulating material which shields the gate electrode from electrical contact along the lateral sides.

As used herein, when a first material is said to be etched selectively with respect to a second material, this means that the first material is etched faster than the second material. For example, the etching process would etch the first material at least two times faster, or at least five times faster, or at least ten times faster, than the second material.

In one or more embodiments, the contacts formed are self-aligned. As used herein, the term "self-aligned contact" refers to a kind of self-aligned via. If the via (contact) patterning has a pattern placement error, the bottom of via still determined by the top surface of the bottom metal.

One or more embodiments of the disclosure advantageously provide three-color hardmask processes for forming contacts. FIGS. 1A-1H illustrate an electronic device 100 formed according to the method of one or more embodiments of the disclosure. The electronic device 100 can be referred to as a metal gate, a transistor, a transistor gate, and the like. The electronic device 100 has a substrate 102 with at least one gate stack 104 formed thereon. The at least one gate stack 104 has a first side 106 and a second side 108 on opposite sides of the at least one gate stack 104. The at least one gate stack 104 comprises a gate 110 and a gate cap 112 formed on the top surface 114 of the gate 110.

The at least one gate cap 112 comprises a first material. The substrate 102 has a spacer material 116 adjacent the first side 106 and the second side 108 of the at least one gate stack 104, a source material 118a with a source cap 120a comprising a second material on an opposite side of the spacer material 116 adjacent the first side 106 of the at least one gate stack 104, a drain material 118b with a drain cap 120b comprising the second material on an opposite side of the spacer material 116 adjacent the second side 108 of the at least one gate stack 104. An interlayer dielectric (ILD) 122 (also referred to as a pre-metal dielectric (PMD)) comprising the second material is formed on the gate cap 112, spacer material 116, source cap 120a, and drain cap 120b, and a first mask layer 124 is formed on the interlayer dielectric (ILD) 122, the interlayer dielectric (ILD) 122 and the first mask layer 124 having an opening 126 exposing one or more of a surface of the gate cap 112, a surface of the spacer material 116, a surface of the source material 118a, or a surface of the drain material 118b. According to the method of one or more embodiments, the gate cap 112 is optionally removed to expose a surface of the gate 110. A contact is then formed on one of the surface of the gate 110, the surface of the source material 118a, or the surface of the drain material 118b.

With reference to FIG. 1A, an electronic device 100 comprises at least one gate stack 104 over an active region on a substrate 102 in accordance with one or more embodiments. The at least one gate stack 104 has a substrate 102 with a gate 110 formed thereon. The gate 110 has a first side 106 and a second side 108 on opposite sides of the gate 110. A gate cap 112 is formed on the top surface 114 of the gate 110.

The substrate 102 can be any suitable substrate material. In one or more embodiments, the substrate 102 comprises a semiconductor material, e.g., silicon (Si), carbon (C), germanium (Ge), silicon germanium (SiGe), gallium arsenide (GaAs), indium phosphorus (InP), indium gallium arsenide (InGaAs), indium aluminum arsenide (InAlAs), other semiconductor materials, or any combination thereof. In some embodiments, substrate 102 is a semiconductor-on-isolator (SOI) substrate including a bulk lower substrate, a middle insulation layer, and a top monocrystalline layer. The top monocrystalline layer may comprise any material listed above, e.g., silicon (Si). In various embodiments, the substrate 102 can be, e.g., an organic, a ceramic, a glass, or a semiconductor substrate. Although a few examples of materials from which the substrate may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present invention.

A spacer material 116 is formed adjacent the first side 106 and the second side 108 of the gate 110 and gate cap 112. The spacer material 116 on either side of the gate 110 can be the same material or different materials. The spacer material 116 adjacent the first side 106 of the at least one gate stack 104 can be referred to as the first spacer material 116 and the spacer material 116 adjacent the second side 108 of at least one gate stack 104 can be referred to as the second spacer material 116. The first spacer material 116 and the second spacer material 116 can be the same material or can be different materials. In one or more embodiments, the first spacer material 116 and the second spacer material 116 are the same material.

A source material 118a with a source cap 120a is formed on the first side 106 of the at least one gate stack 104 opposite the first spacer material 116 and a drain material 118b with a drain cap 120b is formed on the second side 108 of the at least one gate stack 104 opposite the second spacer material 116. While it is noted that in this disclosure, the reference numeral 118a refers to the source material and the reference numeral 118b refers to the drain material, as recognized by one skilled in the art, the positioning of the source and drain materials can be switched such that 118a is the drain material and 118b is the source material. Likewise, while, in this disclosure, the reference numeral 120a refers to the source cap and the reference numeral 120b refers to the drain cap, as recognized by one skilled in the art, the positioning of the source and drain caps can be switched such that 120a is the drain cap and 120b is the source cap. The individual components of the electronic device 100, including the gate 110, the gate cap 112, the spacer material 116, the source material 118a, the drain material 118b, the source cap 120a, and the drain cap 120b, can be formed by any suitable process or processes known to the skilled artisan.

The gate 110 can be made of any suitable material known to the skilled artisan. In one or more embodiments, the gate 110 comprises a metal selected from one or more of copper (Cu), cobalt (Co), tungsten (W), titanium (Ti), molybdenum (Mo), nickel (Ni), ruthenium (Ru), silver (Ag), gold (Au), iridium (Ir), or platinum (Pt). In one or more specific embodiments, the gate 110 comprises a metal selected from one or more of cobalt (Co), tungsten (W), titanium (Ti), molybdenum (Mo), nickel (Ni), ruthenium (Ru), silver (Ag), iridium (Ir), or platinum (Pt). In other specific embodiments, the gate 110 comprises a metal selected from one or more of cobalt (Co), tungsten (W), titanium (Ti), molybdenum (Mo), or ruthenium (Ru).

The gate cap 112 can be made of any suitable material known to the skill artisan. In one or more embodiments, the gate cap 112 comprises a first material. The first material may comprise one or more of tungsten oxide (WO), silicon carbide (SiC), tungsten carbide (WC), silicon nitride (SiN), aluminum oxide (AlO), zirconium oxide (ZrO), and the like. In one or more specific embodiments, the first material may comprise one or more of tungsten oxide (WO), silicon carbide (SiC), tungsten carbide (WC), and the like. In one or more embodiments, the gate cap 112 comprising the first materials is a different material than the source/drain cap 120a/120b and the interlayer dielectric (ILD) 122.

The spacer material 116 of some embodiments comprises a low-K dielectric material. In some embodiments, the low-K dielectric material is selected from silicon carbonitride (SiCN), silicon oxycarbide (SiOC), or silicon oxycarbonitride (SiONC).

The source material 118a and drain material 118b can be any suitable material known to the skilled artisan. In one or more embodiments, the source/drain material 118a/118b comprise one or more of copper (Cu), cobalt (Co), tungsten (W), titanium (Ti), molybdenum (Mo), nickel (Ni), ruthenium (Ru), silver (Ag), gold (Au), iridium (Ir), or platinum (Pt). In one or more specific embodiments, the source/drain material 118a/118b comprise one or more of cobalt (Co), tungsten (W), titanium (Ti), molybdenum (Mo), nickel (Ni), ruthenium (Ru), silver (Ag), iridium (Ir), or platinum (Pt). In other specific embodiments, the source/drain material 118a/118b comprises one or more of cobalt (Co), tungsten (W), titanium (Ti), molybdenum (Mo), or ruthenium (Ru).

The source cap 120a and drain cap 120b can be any suitable material known to the skilled artisan. In one or more embodiments, the source cap 120a and the drain cap 120b comprise a second material. In some embodiments, the second material comprises a dielectric. In specific embodiments, the second material comprises one or more of silicon nitride (SiN), silicon oxynitride ($SiO_xN_y$), or silicon oxide (SiO). While the term "silicon oxide" may be used to describe the second material, the skilled artisan will recognize that the disclosure is not restricted to a particular stoichiometry. For example, the terms "silicon oxide" and "silicon dioxide" may both be used to describe a material having silicon and oxygen atoms in any suitable stoichiometric ratio. The same is true for the other materials listed in this disclosure, e.g. silicon nitride, silicon oxynitride, aluminum oxide, zirconium oxide, and the like.

Figure 1B:
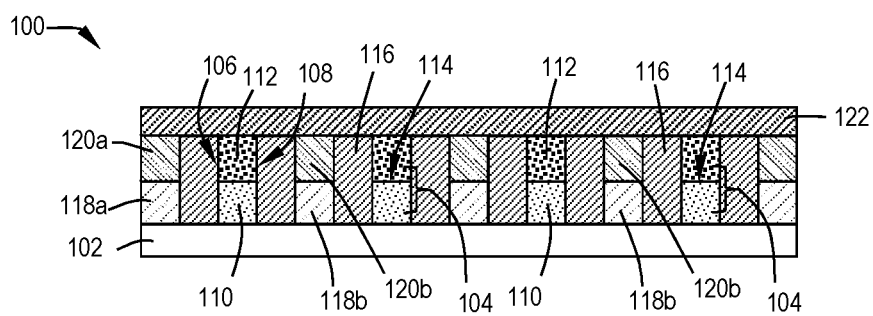
FIG. 1B illustrates a cross-sectional view of a contact over active gate structure according to one or more embodiments of the disclosure.

With reference to FIG. 1B, in one or more embodiments, an interlayer dielectric (ILD) 122 is formed on a top surface of the gate cap 112, a top surface of the spacer material 116, a top surface of the source cap 120a, and on a top surface of the drain cap 120b. The interlayer dielectric (ILD) 122 can be any suitable material known to the skilled artisan. The interlayer dielectric (ILD) 122 can be deposited using one or more deposition techniques known to one of ordinary skill in the art of microelectronic device manufacturing. In one or more embodiments, interlayer dielectric (ILD) 122 is deposited using one of deposition techniques, such as, but not limited to, ALD, CVD, PVD, MBE, MOCVD, spin-on, or other insulating layer deposition techniques known to the skilled artisan. In one or more embodiments, interlayer dielectric (ILD) 122 is an oxide, e.g. silicon oxide.

In one or more embodiments, the interlayer dielectric (ILD) 122 comprises the second material. In other words, in one or more embodiments, the source cap 120a, the drain cap 120b, and the interlayer dielectric (ILD) 122 comprise the same material, the second material. In some embodiments, the second material comprises any dielectric know to one of skill in the art. In specific embodiments, the second material comprises one or more of silicon nitride (SiN), silicon oxynitride ($SiO_xN_y$), silicon oxide (SiO), and the like.

Figure 1C:
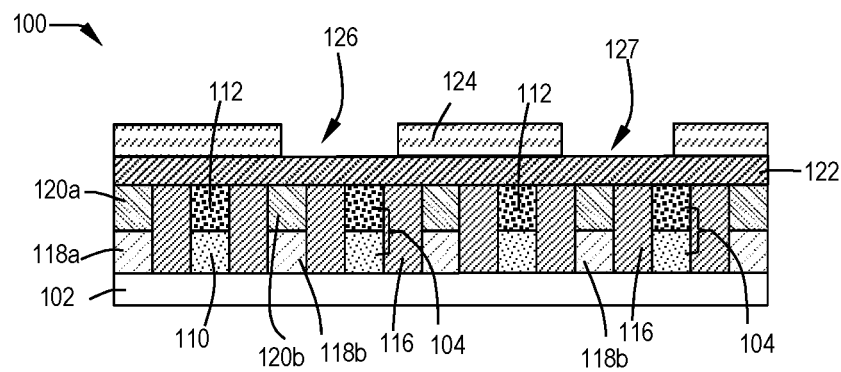
FIG. 1C illustrates a cross-sectional view of a contact over active gate structure according to one or more embodiments of the disclosure.

Referring to FIG. 1C, a first mask layer 124 is then formed on the interlayer dielectric (ILD) 122. The first mask layer 124 can be any suitable material known to the skilled artisan. The first mask layer 124 can be deposited using one or more mask layer deposition techniques known to one of ordinary skill in the art of microelectronic device manufacturing. In one or more embodiments, the first mask layer 124 is deposited using one of deposition techniques, such as, but not limited to, ALD, CVD, PVD, MBE, MOCVD, spin-on, or other insulating layer deposition techniques known to the skilled artisan. In one or more embodiments, the first mask layer 124 comprises a third material selected from one or more of spin-on carbon, hardmask, or a photoresist. In one or more embodiments, the third material comprises an organic planarization material, e.g. titanium nitride (TiN), and the like.

Figure 1D:
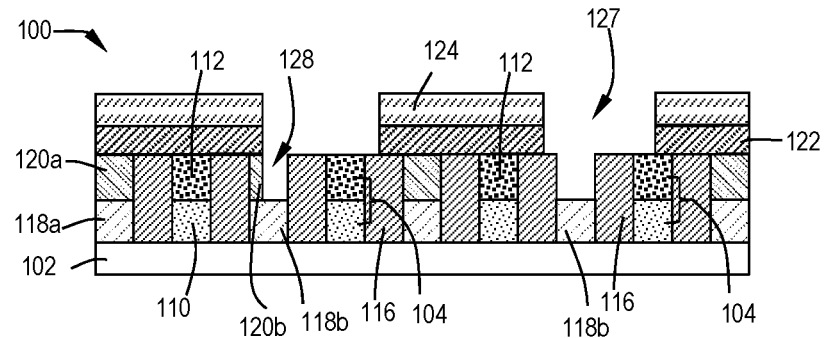
FIG. 1D illustrates a cross-sectional view of a contact over active gate structure according to one or more embodiments of the disclosure.

As illustrated in FIGS. 1C and 1D, in one or more embodiments, the interlayer dielectric (ILD) 122 and the first mask layer 124 have an opening 126 and an opening 127 exposing one or more of a surface of the gate cap 112, a surface of the spacer material 116, a surface of the source material 118a, or a surface of the drain material 118b.

In one or more embodiments, the opening 126 is formed using one or more of the patterning and etching techniques known to one of ordinary skill in the art of microelectronic device manufacturing. Referring to FIG. 1D, in some embodiments, exposing the surface of the source material 118a comprises selectively etching the source cap 120a. In some embodiments, exposing the surface of the drain material 118b comprises selectively etching the drain cap 120b. In one or more embodiments, exposing one of the surface of the source material 118a or the surface of the drain material 118b comprises selectively etching one of the source cap 120a or the drain cap 120b through the opening 126. The electronic device 100 illustrated in FIG. 1D is a three-color gate stack, the second material (from the interlayer dielectric (ILD) 122 and the source/drain cap 120a/120b), the gate cap 112, and the spacer material 116.

In the embodiment illustrated in FIG. 1D, one of the source cap 120a or the drain cap 120b has been removed by a selective etch process to expose one of the surface of the source material 118a or the surface of the drain material 118b forming a gap 128. In some embodiments, substantially all of the source/drain material 118a/118b remains after etching the source/drain cap 120a/120b. As used in this manner, the term "substantially all" means that greater than or equal to about 80%, or 85% or 90% or 95% of the source/drain material 118a/118b remains, based on the initial thickness of the source/drain material 118a/118b.

As illustrated in FIGS. 1C and 1D, in one or more embodiments, the interlayer dielectric (ILD) 122 and the first mask layer 124 have an opening 127 exposing a surface of the gate cap 112 and a surface of the spacer material 116, and exposing one of a surface of the source material 118a or a surface of the drain material 118b. In one or more embodiments, the opening 127 is formed using one or more of the patterning and etching techniques known to one of ordinary skill in the art of microelectronic device manufacturing.

Referring to FIG. 1D, in some embodiments, exposing the surface of the source material 118a comprises selectively etching the source cap 120a. In some embodiments, exposing the surface of the drain material 118b comprises selectively etching the drain cap 120b. In one or more embodiments, exposing one of the surface of the source material 118a or the surface of the drain material 118b comprises selectively etching one of the source cap 120a or the drain cap 120b through the opening 127.

Figure 1E:
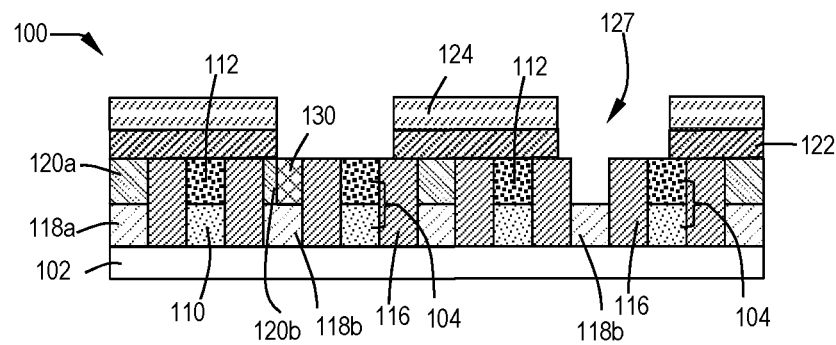
FIG. 1E illustrates a cross-sectional view of a contact over active gate structure according to one or more embodiments of the disclosure.

With reference to FIG. 1E, in one or more embodiments a fill material 130 is selectively deposited into the gap 127 and onto the exposed surface of one of the source material 118a or the drain material 118b. The fill material 130 can be any suitable material known to the skilled artisan. In one or more embodiments, the fill material 130 is selected from one or more of hafnium oxide (HfO), zirconium oxide (ZrO), aluminum oxide (AlO), silicon oxide (SiO), silicon nitride (SiN), or the like.

In some embodiments, a fill material 130 is deposited on a surface of the drain material 118b. It is noted that FIG. 1E depicts the deposition of the fill material 130 on an exposed surface of the drain material 118b. However, as recognized by one of skill in the art, the fill material 130 can be deposited on the exposed surface of the source material 118a, depending upon the configuration of the at least one gate stack 104 with respect to the gate 110 and the gate cap 112. In some embodiments, a fill material 130 is deposited on an exposed surface of the source material 118a.

As used herein, the term "selective deposition" refers to a process whereby materials (e.g. the fill material 130) is deposited in an exact place. In selective deposition, deposition techniques known to those of skill in the art (e.g. atomic layer deposition (ALD), chemical vapor deposition (CVD), and the like) are used to selectively deposit inorganic materials. While there are multiple materials present on the substrate 102, the fill material 130 is only deposited on the exposed surface of the source/drain material 118a/118b. As used herein, the term "selective" means that deposition of the fill material 130 on the exposed surface of the source/drain material 118a/118b occurs instead of deposition on the exposed surface of the spacer 116 or on the exposed surface of the gate cap 112 in a ratio greater than or equal to about 5:1, 10:1, 15:1, 20:1, 25:1, 30:1, 35:1, 40:1, 45:1, 50:1. 100:1, 200:1, 300:1, 400:1, 500:1, 1000:1, or more.

Figure 1F:
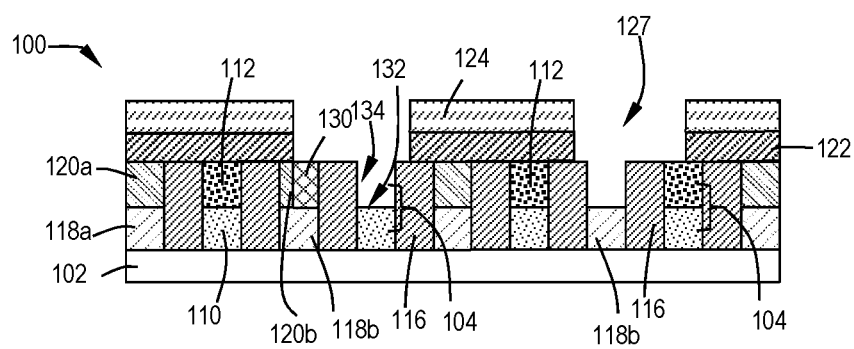
FIG. 1F illustrates a cross-sectional view of a contact over active gate structure according to one or more embodiments of the disclosure.

Referring to FIG. 1F, after selective deposition of the fill material 130 on one of the exposed surface of the source/drain material 118a/118b, the substrate 102 is etched and the gate cap 112 is removed exposing a top surface 132 of the gate 110. The electronic device 100 illustrated in FIG. 1F is a three-color gate stack, the spacer material 116, the gate material 110, and the fill material 130.

In the embodiment illustrated in FIG. 1F, the gate cap 112 has been removed by a selective etch process to expose the top surface 132 of the gate 110 forming a gap 134. In some embodiments, substantially all of the fill material 130 remains after etching the gate cap 112. As used in this manner, the term "substantially all" means that greater than or equal to about 80%, or 85% or 90% or 95% of the fill material 130 remains, based on the initial thickness of the fill material 130. In one or more embodiments, the first mask layer 124 may be removed by any method known to one of skill in the art including, but not limited to, planarization. Thus, in one or more embodiments, the first mask layer 124 may be absent.

Figure 1G:
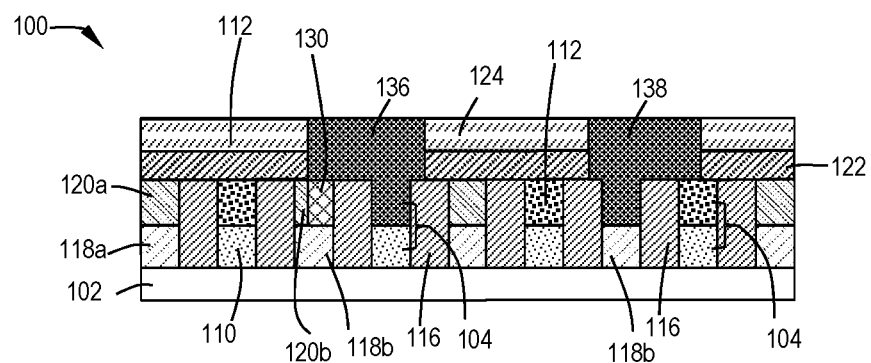
FIG. 1G illustrates a cross-sectional view of a contact over active gate structure according to one or more embodiments of the disclosure.

With reference to FIG. 1G, a gate contact 136 is formed on one of the surface of the gate 110, the surface of the source material 118a, or the surface of the drain material 118b. The gate contact 136 can be any suitable material known to the skilled artisan. In one or more embodiments, the gate contact 136 is selected from one or more of copper (Cu), cobalt (Co), tungsten (W), titanium (Ti), molybdenum (Mo), nickel (Ni), ruthenium (Ru), silver (Ag), gold (Au), iridium (Ir), tantalum (Ta), or platinum (Pt). In one or more specific embodiments, the gate contact 136 comprises one or more of cobalt (Co), tungsten (W), titanium (Ti), molybdenum (Mo), nickel (Ni), ruthenium (Ru), silver (Ag), iridium (Ir), tantalum (Ta), or platinum (Pt). In other specific embodiments, the gate contact 136 comprises one or more of cobalt (Co), tungsten (W), titanium (Ti), tantalum (Ta), molybdenum (Mo), or ruthenium (Ru). In one or more embodiments, the first mask layer 124 may be removed by any method known to one of skill in the art including, but not limited to, planarization. Thus, in one or more embodiments, the first mask layer 124 may be absent.

With reference to FIG. 1G, a source/drain contact 138 is formed on one of the surface of the gate cap 112, the surface of the source material 118a, or the surface of the drain material 118b. The source/drain contact 138 can be any suitable material known to the skilled artisan. In one or more embodiments, the source/drain contact 138 is selected from one or more of copper (Cu), cobalt (Co), tungsten (W), titanium (Ti), molybdenum (Mo), nickel (Ni), ruthenium (Ru), silver (Ag), gold (Au), iridium (Ir), tantalum (Ta), or platinum (Pt). In one or more specific embodiments, the source/drain contact 138 comprises one or more of cobalt (Co), tungsten (W), titanium (Ti), molybdenum (Mo), nickel (Ni), ruthenium (Ru), silver (Ag), iridium (Ir), tantalum (Ta), or platinum (Pt). In other specific embodiments, the source/drain contact 138 comprises one or more of cobalt (Co), tungsten (W), titanium (Ti), tantalum (Ta), molybdenum (Mo), or ruthenium (Ru). In one or more embodiments, the first mask layer 124 may be removed by any method known to one of skill in the art including, but not limited to, planarization. Thus, in one or more embodiments, the first mask layer 124 may be absent. In one or more embodiments, the gate contact 136 and the source/drain contact 138 comprise the same material.

Figure 1H:
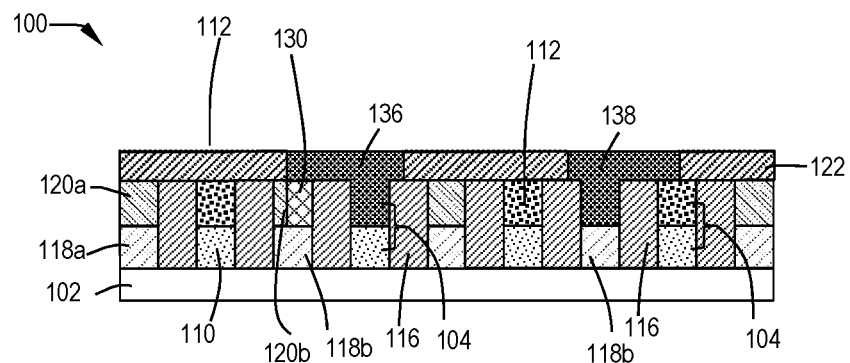
FIG. 1H illustrates a cross-sectional view of a contact over active gate structure according to one or more embodiments of the disclosure.

With reference to FIG. 1H, the first mask layer 124 may be removed such that gate contact 136 is coplanar with the interlayer dielectric (ILD) 122. In some embodiments, the first mask layer 124 is removed prior to forming/depositing contact 136. The first mask layer 124 may be removed by any method known to one of skill in the art, including, but not limited to, planarization.

With reference to FIG. 1H, the first mask layer 124 may be removed such that the source/drain contact 138 is coplanar with the interlayer dielectric (ILD) 222. In some embodiments, the first mask layer 124 is removed prior to forming/depositing the source/drain contact 138. The first mask layer 124 may be removed by any method known to one of skill in the art, including, but not limited to, planarization.

One or more embodiments of the disclosure are directed to a method of forming a contact. In an embodiment, the method comprises forming at least one gate stack over an active region on a substrate, the at least one gate stack having a first side and a second side and comprising a gate and a gate cap on the top surface of the gate. The gate cap comprising a first material. The substrate has a spacer material adjacent the first side and the second side of the at least one gate stack, a source material with a source cap comprising a second material on an opposite side of the spacer material adjacent the first side of the at least one gate stack, a drain material with a drain cap comprising the second material on an opposite side of the spacer material adjacent the second side of the at least one gate stack. An interlayer dielectric (ILD) comprising the second material is formed on the gate cap, spacer material, source cap, and drain cap. A first mask layer is formed on the interlayer dielectric (ILD), the interlayer dielectric (ILD) and the first mask layer having at least one opening. One of the source cap or the drain cap is selectively etched through the at least one opening to expose a surface of the gate cap and a surface of the spacer material, and to expose one of a surface of the source material or a surface of the drain material. A fill material is selectively deposited on one of the exposed surface of the source material or the exposed surface of the drain material. The gate cap is removed to expose a surface of the gate, and a gate contact is formed on the surface of the gate.

One or more embodiments are directed to an electronic device. With reference to FIG. 1E, in one or more embodiments, an electronic device 100 comprises a substrate 102 having an active region with at least one gate stack 104 formed thereon, the at least one gate stack 104 having a first side 106 and a second side 108 and comprising a gate 110 and a gate cap 112 comprising a first material. A spacer material 116 is on the substrate 102 adjacent the first side 106 and second side 108 of the at least one gate stack 104. A source material 118a with a source cap 120a comprising a second material, the source material 118a and the source cap 120a adjacent one of the first side 106 or second side 108 of the at least one gate stack 104 opposite the spacer material 116. A drain material 118b with a drain cap 120b comprising the second material, the drain material 118b and the drain cap 120b adjacent the other of the first side 106 or the second side 108 of the at least one gate stack 104 opposite the spacer material 116. A fill material 130 is on the drain material 118b (or the source material 118a). The fill material 130 has a top surface substantially coplanar with one or more of a top surface of the spacer material 116, a top surface of the drain cap 120b, or a top surface of the source cap 120a. An interlayer dielectric (ILD) 122 is on one or more of the spacer material, the gate cap, the drain cap, or the source cap, and, optionally, a first mask layer 124 is on the interlayer dielectric (ILD) 122.

With reference to FIG. 1F, in one or more embodiments, the electronic device 100 may further comprise at least one opening 132 in the interlayer dielectric (ILD) 122 exposing a surface of one or more of the fill material 130, the spacer material 116, the gate material 110, or the source/drain material 118a/118b.

With reference to FIG. 1G, the electronic device 100 may further comprise at least one of a gate contact 136 or a source/drain contact 138 on one or more of the exposed surface of the fill material 130, the spacer material 116, the gate material 110, or the source/drain material 118a/118b.

According to one or more embodiments, the substrate is subjected to processing prior to and/or after forming the contact. This processing can be performed in the same chamber or in one or more separate processing chambers. In some embodiments, the substrate is moved from the first chamber to a separate, second chamber for further processing. The substrate can be moved directly from the first chamber to the separate processing chamber, or the substrate can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific portions of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

During processing, the substrate can be heated or cooled. Such heating or cooling can be accomplished by any suitable means including, but not limited to, changing the temperature of the substrate support (e.g., susceptor) and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

Figure 2:
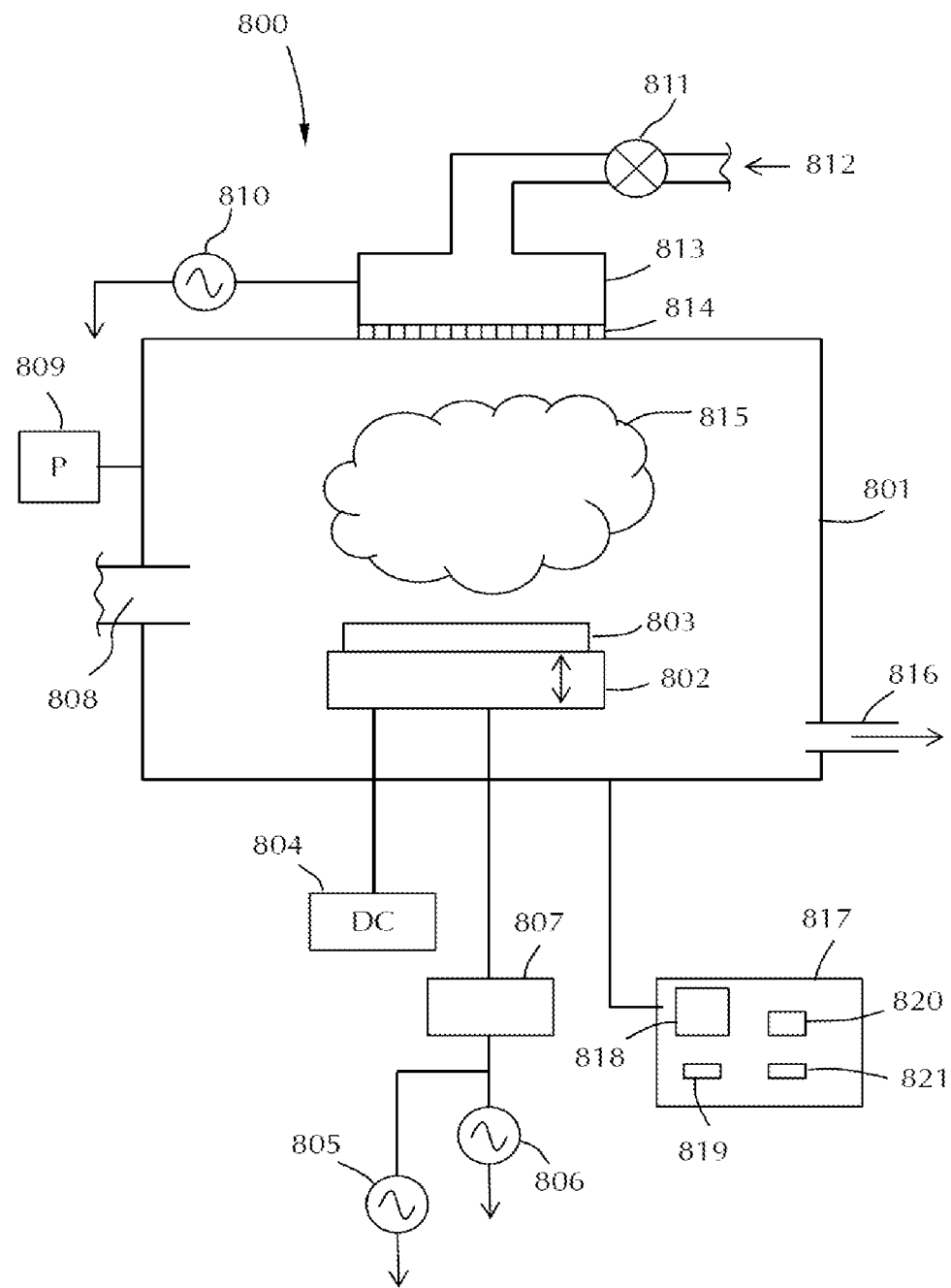
FIG. 2 is a block diagram of a process chamber in accordance with one or more embodiment of the disclosure.

FIG. 2 shows a block diagram of a plasma system 800 to perform at least some of the method of one or more embodiments. The plasma system 800 illustrated has a processing chamber 801. A movable pedestal 802 to hold a substrate 803 that has been positioned in processing chamber 801. Pedestal 802 can comprise an electrostatic chuck ("ESC"), a DC electrode embedded into the ESC, and a cooling/heating base. In an embodiment, pedestal 802 acts as a moving cathode. In an embodiment, the ESC comprises an $Al_2O_3$ material, $Y_2O_3$, or other ceramic materials known to one of ordinary skill of electronic device manufacturing. A DC power supply 804 can be connected to the DC electrode of the pedestal 802. In some embodiments, the pedestal 802 includes a heater (not shown) that is capable of raising the temperature of the substrate to the first temperature. While an electrostatic chuck is illustrated as the pedestal 802, those skilled in the art will understand that this is merely exemplary and other pedestal types are within the scope of the disclosure.

As shown in FIG. 2, a substrate 803 can be loaded through an opening 808 and placed on the pedestal 802. Plasma system 800 comprises an inlet to input one or more process gases 812 through a mass flow controller 811 to a plasma source 813. A plasma source 813 comprising a showerhead 814 is coupled to the processing chamber 801 to receive one or more process gases 812 to generate plasma. Plasma source 813 is coupled to a RF source power 810. Plasma source 813 through showerhead 814 generates a plasma 815 in processing chamber 801 from one or more process gases 812 using a high frequency electric field. Plasma 815 comprises plasma particles, such as ions, electrons, radicals, or any combination thereof. In an embodiment, power source 810 supplies power from about 50 W to about 3000 W at a frequency from about 400 kHz to about 162 MHz to generate plasma 815.

A plasma bias power 805 is coupled to the pedestal 802 (e.g., cathode) via a RF match 807 to energize the plasma. In an embodiment, the plasma bias power 805 provides a bias power that is not greater than 1000 W at a frequency between about 2 MHz to 60 MHz, and in a particular embodiment at about 13 MHz. A plasma bias power 806 may also be provided, for example, to provide another bias power that is not greater than 1000 W at a frequency from about 400 kHz to about 60 MHz, and in a particular embodiment, at about 60 MHz. Plasma bias power 806 and plasma bias power 805 are connected lo RF match 807 to provide a dual frequency bias power. In an embodiment, a total bias power applied to the pedestal 802 is from about 10 W to about 3000 W.

As shown in FIG. 2, a pressure control system 809 provides a pressure to processing chamber 801. The chamber 801 has one or more exhaust outlets 816 to evacuate volatile products produced during processing in the chamber. In an embodiment, the plasma system 800 is an inductively coupled plasma (ICP) system. In an embodiment, the plasma system 800 is a capacitively coupled plasma (CCP) system.

In some embodiments, a control system 817 is coupled to the processing chamber 801. The control system 817 comprises a processor 818, a temperature controller 819 coupled to the processor 818, a memory 820 coupled to the processor 818, and input/output devices 821 coupled to the processor 818. The memory 820 can include one or more of transitory memory (e.g., random access memory) and non-transitory memory (e.g., storage).

The control system 817 can be configured to perform at least some of the methods as described herein and may be either software or hardware or a combination of both. The plasma system 800 may be any type of high performance processing plasma systems known in the art, such as but not limited to an etcher, a cleaner, a furnace, or any other plasma system to manufacture electronic devices.

Figure 3:
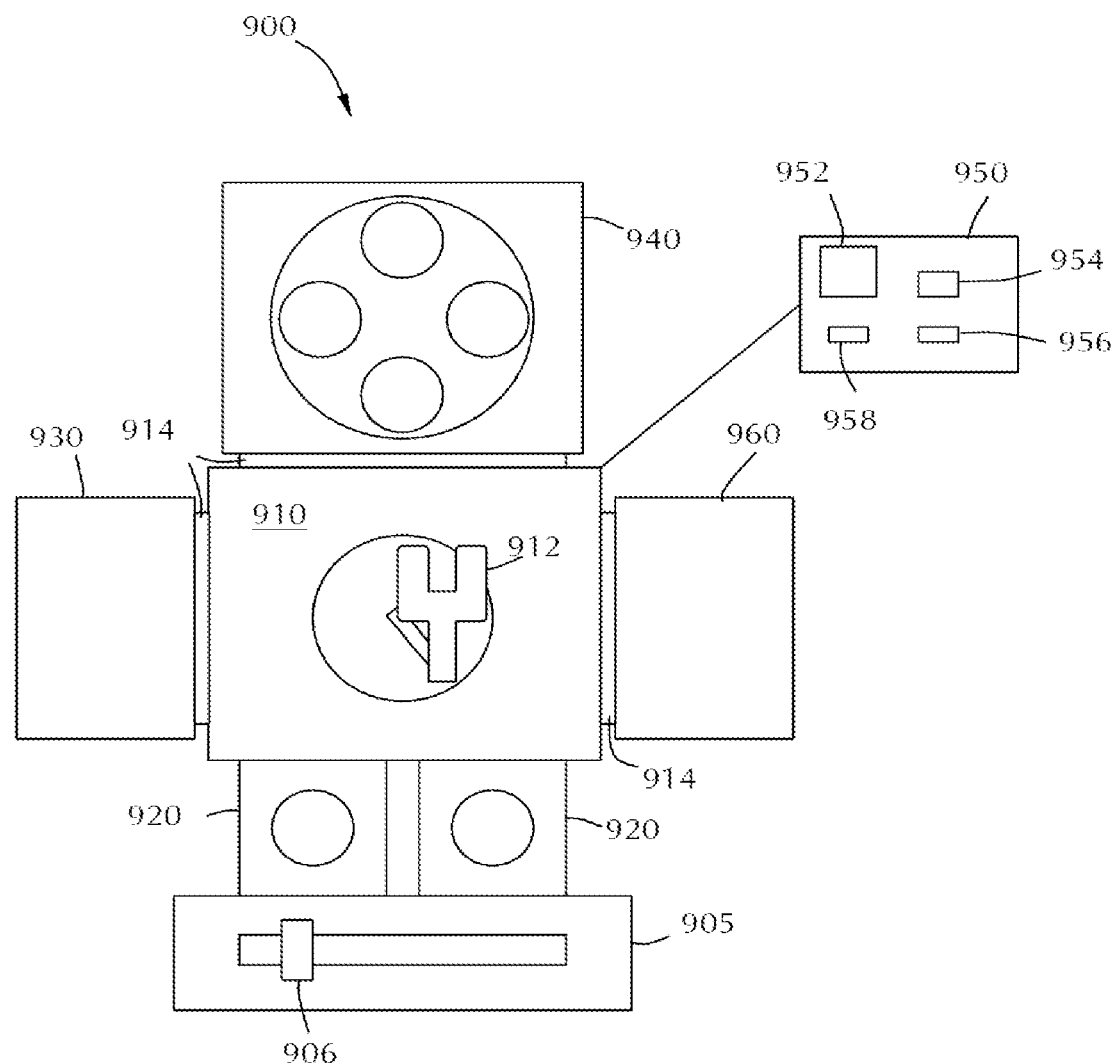
FIG. 3 is a block diagram of a cluster tool system in accordance with one or more embodiment of the disclosure.

FIG. 3 illustrates a system 900 that can be used to process a substrate according to one or more embodiment of the disclosure. The system 900 can be referred to as a cluster tool. The system 900 includes a central transfer station 910 with a robot 912 therein. The robot 912 is illustrated as a single blade robot; however, those skilled in the art will recognize that other robot 912 configurations are within the scope of the disclosure. The robot 912 is configured to move one or more substrate between chambers connected to the central transfer station 910.

At least one pre-clean chamber 920 is connected to the central transfer station 910. The pre-clean chamber 920 can include one or more of a heater, a radical source or plasma source. The pre-clean chamber 920 is in fluid communication with an activating agent. An exemplary pre-clean chamber 920 is illustrated in FIG. 2 as a plasma system 800.

In some embodiments, there are two pre-clean chambers 920 connected to the central transfer station 910. In the embodiment shown in FIG. 3, the pre-clean chambers 920 can act as pass through chambers between the factory interface 905 and the central transfer station 910. The factory interface 905 can include one or more robot 906 to move substrate from a cassette to the pre-clean chamber 920.

The robot 912 can them move the substrate from the pre-clean chamber 920 to other chambers within the system 900.

A deposition chamber 930 can be connected to the central transfer station 910. The deposition chamber 930 comprising a pedestal to hold a substrate. The deposition chamber 930 is in fluid communication with one or more reactive gas sources to provide one or more flows of reactive gases to the deposition chamber 930.

The deposition chamber 930 can be any suitable chamber that can provide a flow of molecules and control the temperature of the substrate. The plasma system 800 shown in FIG. 2 can also be used as the deposition chamber 930. The substrate can be moved to and from the deposition chamber 930 by the robot 912 passing through isolation valve 914.

A selective deposition chamber 940 can also be connected to the central transfer station 910. The selective deposition chamber 940 can be any suitable deposition chamber including, but not limited to, CVD, ALD, PECVD, PEALD, or PVD chambers. In some embodiments, the selective deposition chamber 940 comprises an ALD chamber. The ALD chamber can be a time-domain chamber where the reactive gases are sequentially exposed to the substrate so that only one reactive gas is present in the chamber at any given time. In some embodiments, the ALD chamber is a spatial ALD chamber with the reactive gases are flowed into separate regions of the processing chamber at the same time and the reactive gases are separated by a gas curtain to prevent gas phase reactions between the reactive gases. In a spatial ALD chamber, the substrate is moved between regions of the processing chamber containing the various reactive gases to deposit a film.

Other process chambers can be connected to the central transfer station 910. In the embodiment shown, an ashing chamber 960 is connected to the central transfer station 910 through isolation valve 914. The ashing chamber 960 can be any suitable chamber that can remove the thin film after selective deposition.

At least one controller 950 is coupled to the central transfer station 910, the pre-clean chamber 920, the deposition chamber 930, the selective deposition chamber 940, or the ashing chamber 960. In some embodiments, there are more than one controller 950 connected to the individual chambers or stations and a primary control processor is coupled to each of the separate processors to control the system 900. The controller 950 may be one of any form of general-purpose computer processor, microcontroller, microprocessor, etc., that can be used in an industrial setting for controlling various chambers and sub-processors.

The at least one controller 950 can have a processor 952, a memory 954 coupled to the processor 952, input/output devices 956 coupled to the processor 952, and support circuits 958 to communication between the different electronic components. The memory 954 can include one or more of transitory memory (e.g., random access memory) and non-transitory memory (e.g., storage).

The memory 954, or computer-readable medium, of the processor may be one or more of readily available memory such as random access memory (RAM), read-only memory (ROM), floppy disk, hard disk, or any other form of digital storage, local or remote. The memory 954 can retain an instruction set that is operable by the processor 952 to control parameters and components of the system 900. The support circuits 958 are coupled to the processor 952 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a contact, the method comprising:
    forming at least one gate stack over an active region on a substrate, the at least one gate stack having a first side and a second side and comprising a gate and a gate cap comprising a first material, the substrate having a spacer material adjacent the first side and the second side of the at least one gate stack, a source material with a source cap comprising a second material on an opposite side of the spacer material adjacent the first side of the at least one gate stack, a drain material with a drain cap comprising the second material on an opposite side of the spacer material adjacent the second side of the at least one gate stack;

forming an interlayer dielectric (ILD) comprising the second material on the gate cap, spacer material, source cap, and drain cap, and a first mask layer on the interlayer dielectric (ILD), the interlayer dielectric (ILD) and the first mask layer having at least one opening exposing a surface of the gate cap, a surface of the spacer material, a surface of the source material, and a surface of the drain material;

selectively etching one of the source cap or the drain cap through the at least one opening to expose one of a surface of the source material or a surface of the drain material;

selectively depositing a fill material on one of the exposed surface of the source material or the exposed surface of the drain material, the fill material having a top surface substantially coplanar with a top surface of the spacer material and with a top surface of the drain cap or a top surface of the source cap;

removing the gate cap to expose a surface of the gate;

forming a gate contact on one of the surface of the gate, the surface of the source material, or the surface of the drain material; and forming a source/drain contact on one or more of the surface of the gate material, the surface of the drain material, the surface of the spacer material, or the surface of the gate cap.

2. The method of claim 1, wherein the fill material is selected from one or more of hafnium oxide, zirconium oxide, aluminum oxide, silicon oxide, silicon nitride, or the like.

3. The method of claim 1, wherein the gate comprises a metal selected from one or more of cobalt, tungsten, titanium, molybdenum, nickel, ruthenium, silver, iridium, or platinum.

4. The method of claim 1, wherein the first material comprises one or more of silicon carbide, tungsten oxide, tungsten carbide, silicon nitride, aluminum oxide, or zirconium oxide.

5. The method of claim 1, wherein the spacer material comprises a low-κ dielectric.

6. The method of claim 5, wherein the low-κ dielectric comprises one or more of silicon oxycarbide, silicon oxynitride, silicon carbonitride, or silicon oxycarbonitride.

7. The method of claim 1, wherein the second material comprises one or more of silicon nitride, silicon oxynitride, or silicon oxide.

8. The method of claim 1, wherein the first mask layer comprises a third material selected from one or more of a spin-on carbon, hardmask, or a photoresist.

9. The method of claim 1, wherein the gate contact and the source/drain contact independently comprises one or more of copper (Cu), cobalt (Co), tungsten (W), titanium (Ti), tantalum (Ta), molybdenum (Mo), nickel (Ni), ruthenium (Ru), silver (Ag), gold (Au), iridium (Ir), or platinum (Pt).

10. A method of forming a contact, the method comprising:

forming at least one gate stack over an active region on a substrate, the at least one gate stack having a first side and a second side and comprising a gate and a gate cap comprising a first material, the substrate having a spacer material adjacent the first side and the second side of the at least one gate stack, a source material with a source cap comprising a second material on an opposite side of the spacer material adjacent the first side of the at least one gate stack, a drain material with a drain cap comprising the second material on an opposite side of the spacer material adjacent the second side of the at least one gate stack;

forming an interlayer dielectric (ILD) comprising the second material on the gate cap, spacer material, source cap, and drain cap;

forming a first mask layer on the interlayer dielectric (ILD), the interlayer dielectric (ILD) and the first mask layer having at least one opening;

selectively etching one of the source cap or the drain cap through the at least one opening to expose one of a surface of the source material or a surface of the drain material;

selectively depositing a fill material on one of the exposed surface of the source material or the exposed surface of the drain material, the fill material having a top surface substantially coplanar with a top surface of the spacer material and with a top surface of the drain cap or a top surface of the source cap;

removing the gate cap to expose a surface of the gate; and forming a gate contact on the surface of the gate.

11. The method of claim 10, wherein the fill material is selected from one or more of hafnium oxide, zirconium oxide, aluminum oxide, silicon oxide, silicon nitride, or the like.

12. The method of claim 10, wherein the gate comprises a metal selected from one or more of cobalt, tungsten, titanium, molybdenum, nickel, ruthenium, silver, iridium, or platinum.

13. The method of claim 10, wherein the first material comprises one or more of silicon carbide, tungsten oxide, tungsten carbide, silicon nitride, aluminum oxide, or zirconium oxide.

14. The method of claim 10, wherein the spacer material comprises a low-κ dielectric.

15. The method of claim 10, wherein the second material comprises one or more of silicon nitride, silicon oxynitride, or silicon oxide.

16. The method of claim 10, wherein the first mask layer comprises a third material selected from one or more of a spin-on carbon, hardmask, or a photoresist.

17. The method of claim 10, wherein the gate contact comprises one or more of copper (Cu), cobalt (Co), tungsten (W), titanium (Ti), tantalum (Ta), molybdenum (Mo), nickel (Ni), ruthenium (Ru), silver (Ag), gold (Au), iridium (Jr), or platinum (Pt).

* * * * *